(12) United States Patent
Yun et al.

(10) Patent No.: US 10,580,714 B2
(45) Date of Patent: Mar. 3, 2020

(54) NANO FLAKE DEFECT PASSIVATION METHOD AND ELECTRONIC DEVICE MANUFACTURED USING THE SAME

(71) Applicant: ELECTRONICS AND TELECOMMUNICATIONS RESEARCH INSTITUTE, Daejeon (KR)

(72) Inventors: Sun Jin Yun, Daejeon (KR); Junjae Yang, Daejeon (KR); Changbong Yeon, Namyangju-si (KR); JungWook Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/175,284

(22) Filed: Oct. 30, 2018

(65) Prior Publication Data
US 2019/0131201 A1    May 2, 2019

(30) Foreign Application Priority Data

Nov. 1, 2017  (KR) .................... 10-2017-0144962
Sep. 28, 2018 (KR) .................... 10-2018-0116621

(51) Int. Cl.
*H01L 21/02* (2006.01)
*H01L 23/31* (2006.01)
(Continued)

(52) U.S. Cl.
CPC .... *H01L 23/3171* (2013.01); *H01L 21/02175* (2013.01); *H01L 21/02282* (2013.01);
(Continued)

(58) Field of Classification Search
CPC ............... H01L 21/02; H01L 21/02527; H01L 21/02175; H01L 21/02282;
(Continued)

(56) References Cited

U.S. PATENT DOCUMENTS 5,459,084 A  10/1995  Ryum et al.
5,639,677 A   6/1997  Lee et al.
(Continued)

OTHER PUBLICATIONS

Jun Young Choi et al., "Properties of Cadmium Sulfide Thin Films Deposited by Chemical Bath Deposition With Ultrasonication", Solar Energy, vol. 64, Nos. 1-3, pp. 41-47, Sep. 1998.
Paul O'Brien et al., "Developing an understanding of the processes controlling the chemical bath deposition of ZnS and CdS", J. Mater. Chem., Aug. 1998, 8(11), p. 2309-2314.
(Continued)

*Primary Examiner* — Chuong A Luu
(74) *Attorney, Agent, or Firm* — Rabin & Berdo, P.C.

(57) ABSTRACT

Provided is method of manufacturing a conductive film. The method includes forming a conductive film including a plurality of flakes on a substrate, wherein the conductive film is a semiconductor or a conductor, and forming a passivation region selectively on a boundary between the flakes adjacent to each other. The passivation region includes a metal compound selected from the group consisting of metal chalcogenide and transition metal chalcogenide. The forming of the passivation region includes providing a solution containing a first precursor including a cation of the metal compound and a second precursor including an anion of the metal compound on the conductive film. pH of the solution is between 7.0 and 10.0.

10 Claims, 9 Drawing Sheets

(51) Int. Cl.
*H01L 29/16* (2006.01)
*H01L 23/29* (2006.01)
*H01L 29/24* (2006.01)

(52) U.S. Cl.
CPC .. *H01L 21/02422* (2013.01); *H01L 21/02527* (2013.01); *H01L 21/02557* (2013.01); *H01L 21/02568* (2013.01); *H01L 21/02587* (2013.01); *H01L 21/02628* (2013.01); *H01L 23/29* (2013.01); *H01L 23/291* (2013.01); *H01L 29/1606* (2013.01); *H01L 29/24* (2013.01); *H01L 21/02601* (2013.01)

(58) Field of Classification Search
CPC ......... H01L 21/02587; H01L 21/02568; H01L 21/02422; H01L 21/02557; H01L 21/02628; H01L 21/02601; H01L 21/02417; H01L 21/02485; H01L 31/0324; H01L 23/29; H01L 23/31; H01L 23/291; H01L 23/3171
USPC ............................................. 438/84, 95, 102
See application file for complete search history.

(56) References Cited

U.S. PATENT DOCUMENTS

| | | | |
|---|---|---|---|
| 5,760,418 A | 6/1998 | Lee et al. | |
| 6,639,327 B2* | 10/2003 | Momoi | H01L 21/3226 257/131 |
| 7,064,360 B2* | 6/2006 | Franosch | H01L 29/66242 257/197 |
| 9,780,176 B2 | 10/2017 | Lee et al. | |
| 2004/0124427 A1 | 7/2004 | Hsu et al. | |
| 2006/0097243 A1* | 5/2006 | Bromberger | H01L 29/1004 257/19 |
| 2017/0236959 A1 | 8/2017 | Mahler | |

OTHER PUBLICATIONS

Fouad Ouachtari et al., "Influence of Bath Temperature, Deposition Time and [S]/[Cd] Ratio on the Structure, Surface Morphology, Chemical Composition and Optical Properties of CdS Thin Films Elaborated by Chemical Bath Deposition", Journal of Modern Physics, May 2011, 2, p. 1073-1082.

\* cited by examiner

NANO FLAKE DEFECT PASSIVATION METHOD AND ELECTRONIC DEVICE MANUFACTURED USING THE SAME

CROSS-REFERENCE TO RELATED APPLICATIONS

This U.S. non-provisional patent application claims priority under 35 U.S.C. § 119 of Korean Patent Applications No. 10-2017-0144962, filed on Nov. 1, 2017, and No. 10-2018-0116621, filed on Sep. 28, 2018, the entire contents of which are hereby incorporated by reference.

BACKGROUND

The present disclosure herein relates to a method of manufacturing a conductive film for passivating defects of a nanosheet and a film composed of a nanosheet, and an electronic device manufactured using the method.

In a two-dimensional material, electrons move only along the layer in one layer having ideal crystallinity, and it has very fast mobility. In relation to a layer of two-dimensional material, since layers are bonded to each other by van der Waals forces, the interlayer bonding force is weak and the layer is easily exfoliated. Also, due to this nature of the two-dimensional material, electronic devices having excellent electrical characteristics may be manufactured since the charges do not endure scattering due to interaction with the surrounding matters while the charges move along the layer. In the case of an electronic device using a two-dimensional semiconductor, an electronic device is manufactured through a method of transferring a nanosheet exfoliated from a single crystal by a tape and the like onto a substrate and forming an electrode on the nanosheet using an extremely fine patterning technique such as electron beam lithography, or an electronic device is manufactured using a large-area deposited film through a conventional electronic device manufacturing process. In the former case, since the qualities of single crystal nanosheets are excellent, it is a technology that may manufacture electronic devices with excellent characteristics but may not be applied to production. In the latter case, since the two-dimensional material film having excellent characteristics may not be formed by the large-area deposition method, an electronic device having a very low characteristic may be obtained.

SUMMARY

The inventive concept is to provide a method of manufacturing a film composed of two-dimensional material nanosheets to improve electrical characteristics.

The present disclosure is also to provide an electronic device having improved electrical characteristics.

An embodiment of the inventive concept provides a method of manufacturing a conductive film, the method including: forming a conductive film including a plurality of flakes on a substrate, wherein the conductive film is a semiconductor or a conductor; and forming a passivation region selectively on a boundary between the flakes adjacent to each other, wherein the passivation region includes a metal compound selected from the group consisting of metal chalcogenide and transition metalchalcogenide, wherein the forming of the passivation region includes providing a solution containing a first precursor including a cation of the metal compound and a second precursor including an anion of the metal compound on the conductive film, wherein pH of the solution is between 7.0 and 10.0.

In an embodiment, the metal compound may be represented by a formula of $M_aX_b$, where M includes Zn or Cd, X includes S, Se, O or Te, and a and b are independently an integer of 1 or more.

In an embodiment, a ratio of a molar concentration of an anion of the metal compound to a molar concentration of a cation of the metal compound in the solution may be 9 to 20.

In an embodiment, the boundary may be a grain boundary.

In an embodiment, each of the flakes may include metal chalcogenide, transition metal chalcogenide, or graphene, wherein each of the flakes may include a monolayer, or a multi-layer where two to ten monolayers are stacked.

In an embodiment, the forming of the conductive film may include: exfoliating metal chalcogenide, transition metal chalcogenide, or graphene to form the flakes dispersed in a solution; and uniformly providing the flakes on the substrate.

In an embodiment, the passivation region may be formed in a plurality and may be arranged along the boundary.

In an embodiment, the passivation region may not be formed on the upper surfaces of the flakes.

In an embodiment, the flakes adjacent to each other may be spaced apart from each other with the boundary therebetween, wherein the passivation region may be formed to fill the boundary to connect the flakes adjacent to each other.

In an embodiment, the flakes adjacent to each other may include a first flake and a second flake on the first flake, wherein the second flake may cover at least a portion of the upper surface of the first flake, wherein the boundary may be defined at an edge of the second flake on the upper surface of the first flake.

In an embodiment of the inventive concept, an electronic device includes: a substrate; a conductive film including a plurality of flakes on the substrate, wherein the conductive film is a semiconductor or a conductor; and a passivation region provided selectively on a boundary between the flakes adjacent to each other, wherein each of the flakes includes metal chalcogenide, transition metal chalcogenide, or graphene, wherein each of the flakes includes a monolayer, or a multi-layer where two to ten monolayers are stacked, wherein the passivation region includes a metal compound selected from the group consisting of metal chalcogenide and transition metal chalcogenide.

In an embodiment, the metal compound may be represented by a formula of $M_aX_b$, where M includes Zn or Cd, X includes S, Se, O or Te, and a and b are independently an integer of 1 or more.

In an embodiment, the boundary may be a grain boundary.

In an embodiment, the passivation region may be provided in a plurality and may be arranged along the boundary.

In an embodiment, the passivation region may not be formed on the upper surfaces of the flakes.

In an embodiment, the flakes adjacent to each other may be spaced apart from each other with the boundary therebetween, wherein the passivation region may fill the boundary to connect the flakes adjacent to each other.

In an embodiment, the flakes adjacent to each other may include a first flake and a second flake on the first flake, wherein the second flake may cover at least a portion of the upper surface of the first flake, wherein the boundary may be defined at an edge of the second flake on the upper surface of the first flake.

In an embodiment, the electronic device may further include a first electrode and a second electrode on the substrate, wherein the conductive film may be provided between the first electrode and the second electrode to electrically connect them.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
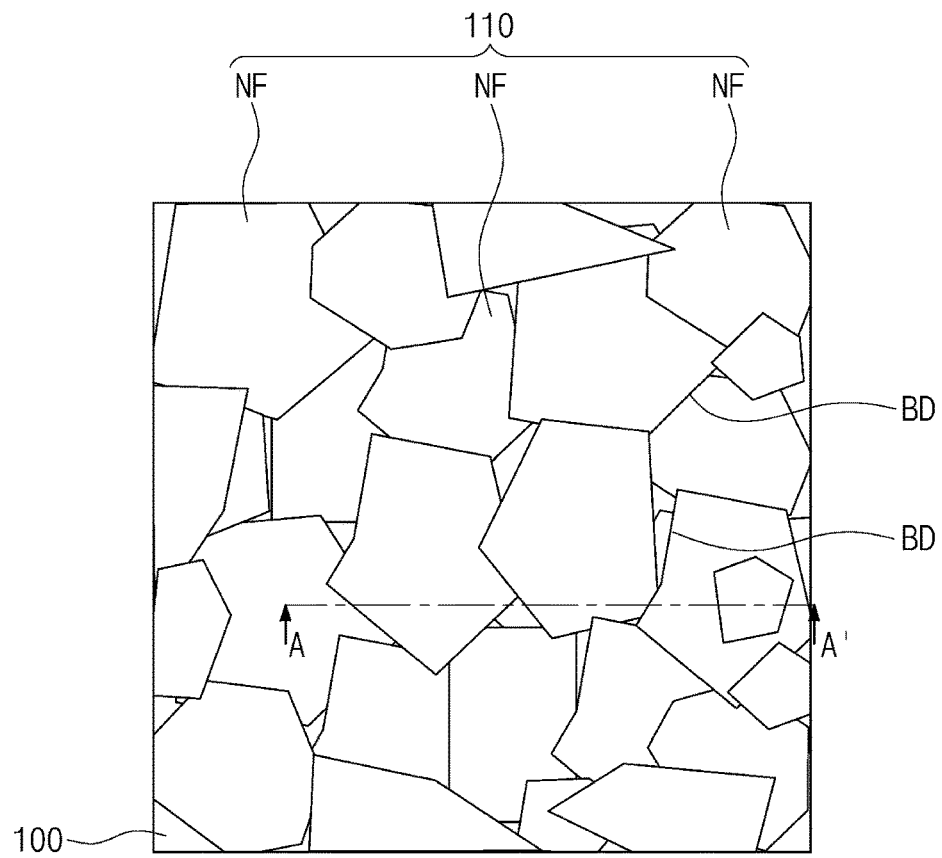
FIGS. 1 and 3 are plan views illustrating a method of manufacturing a conductive film according to embodiments of the inventive concept.

In order to fully understand the configuration and effects of the technical spirit of the inventive concept, preferred embodiments of the technical spirit of the inventive concept will be described with reference to the accompanying drawings. However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely.

It will also be understood that when a layer (or film) is referred to as being 'on' another layer or substrate, it may be directly on the other layer or substrate, or intervening layers may also be present. Additionally, in the drawings, the thicknesses of components are exaggerated for effective description. Like reference numerals refer to like elements throughout the specification.

It will be understood that the terms "first" and "second" are used herein to describe various components but these components should not be limited by these terms. These terms are just used to distinguish a component from another component. Embodiments described herein include complementary embodiments thereof.

The terms used in this specification are used only for explaining specific embodiments while not limiting the inventive concept. The terms of a singular form may include plural forms unless referred to the contrary. The meaning of "comprises," and/or "comprising" in this specification specifies the mentioned component but does not exclude at least one another component.

Figure 2:
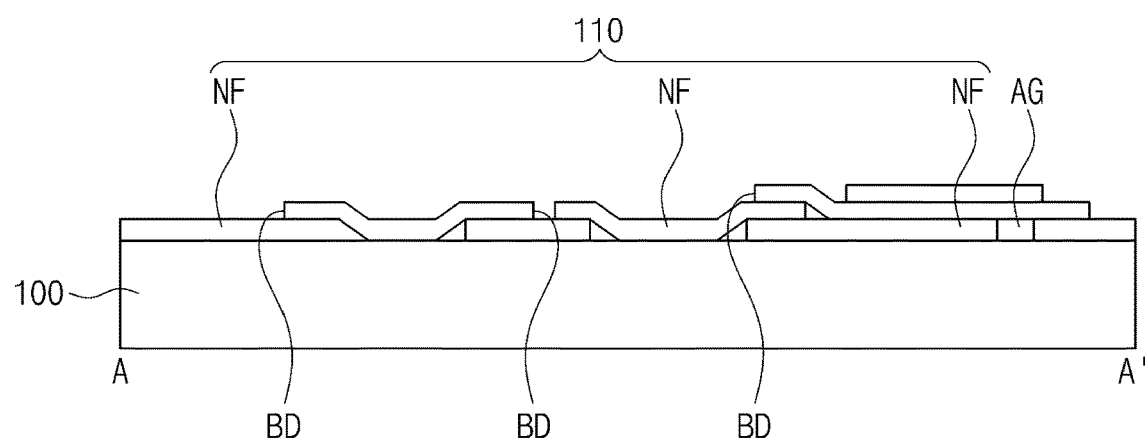
FIGS. 2 and 4 are cross-sectional views taken along the line A-A' in FIGS. 1 and 3, respectively.
Figure 3:
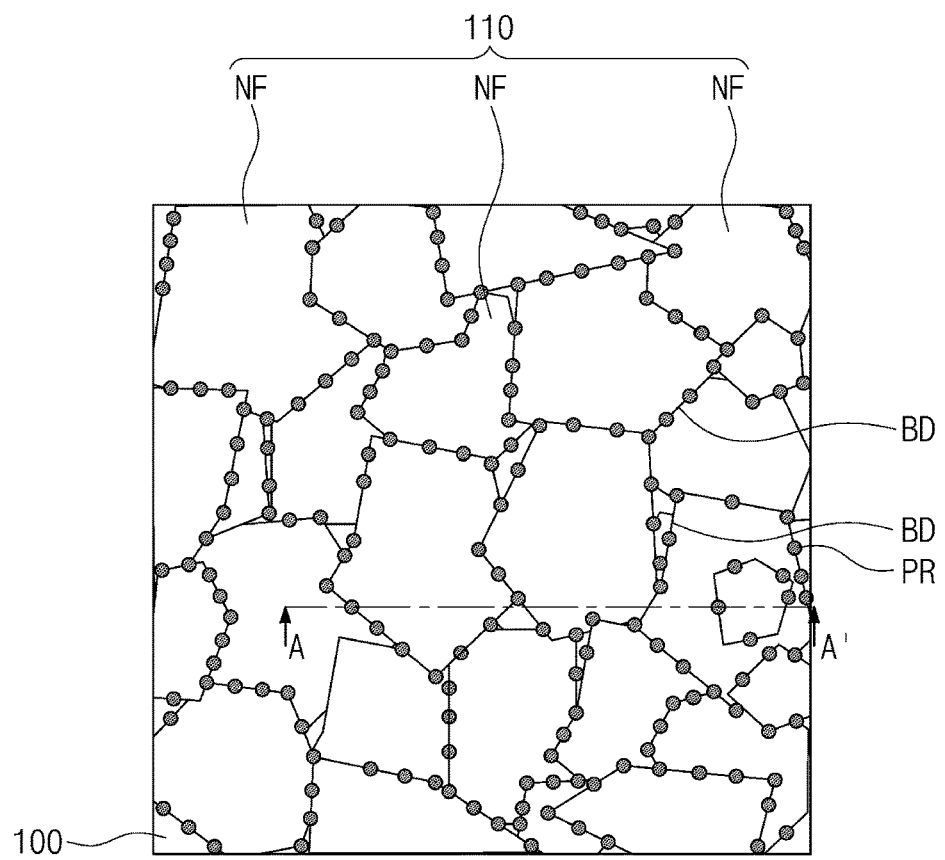
Figure 4:
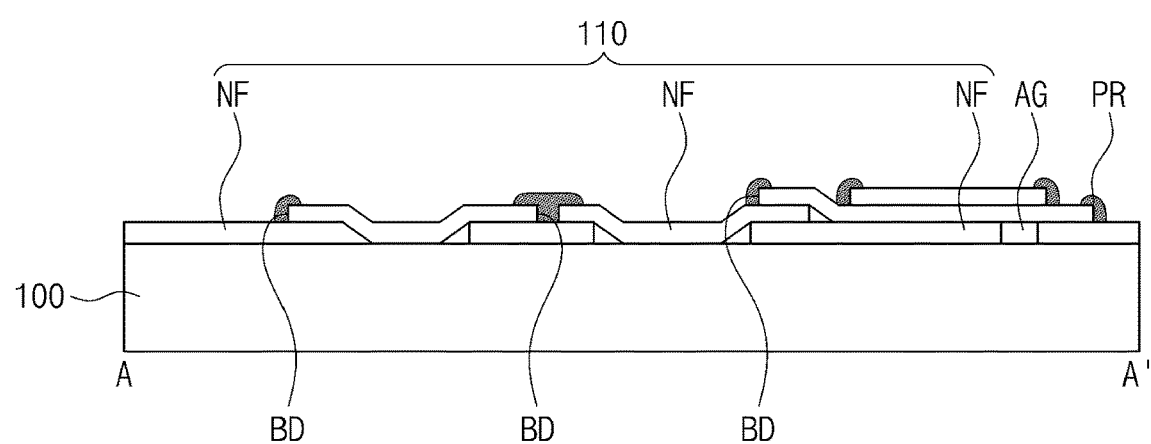
Figure 5:
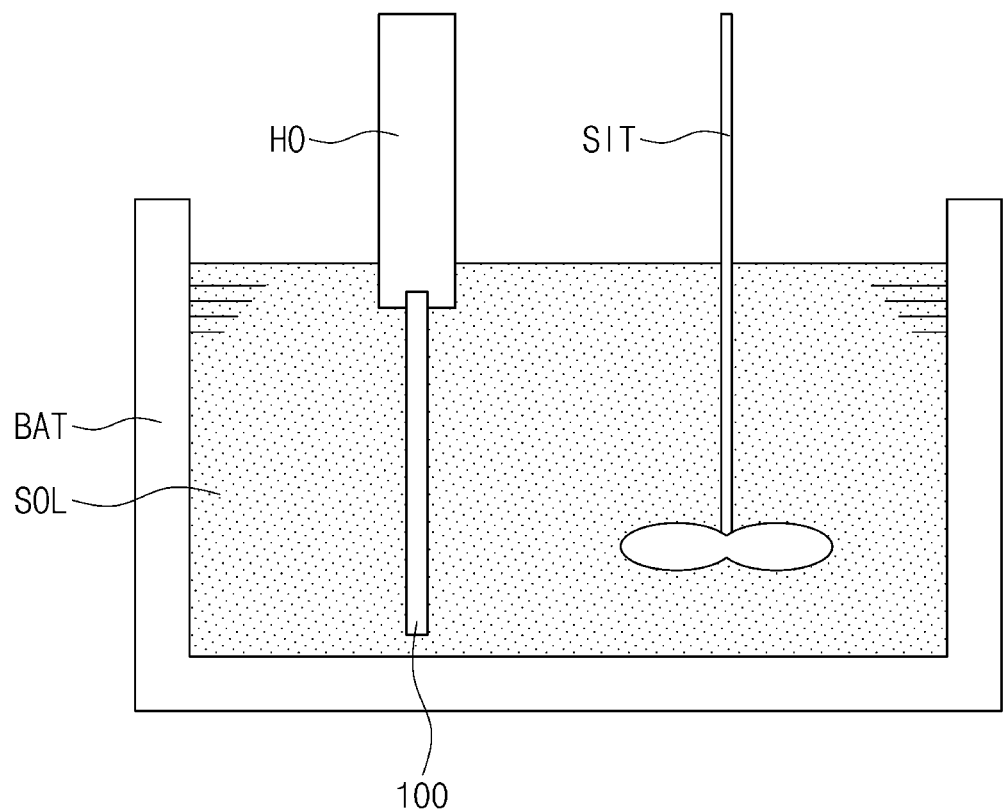
FIG. 5 is a cross-sectional view schematically showing a system in which deposition is performed by a chemical reaction in a solution.

FIGS. 1 and 3 are plan views illustrating a method of manufacturing a conductive film according to embodiments of the inventive concept. FIGS. 2 and 4 are cross-sectional views taken along the line A-A' in FIGS. 1 and 3, respectively. FIG. 5 is a cross-sectional view schematically showing a system in which deposition is performed by a chemical reaction in a solution.

Referring to FIGS. 1 and 2, a conductive film 110 may be formed on a substrate 100. The substrate 100 may be a semiconductor substrate, a glass substrate, or a polymer substrate. However, the inventive concept is not limited thereto, and the type of the substrate 100 may be variously changed. The conductive film 110 may include a plurality of flakes NF. In other words, the flakes NF formed on the substrate 100 may constitute the conductive film 110. The conductive film 110 may be a semiconductor or a conductor.

Each flake NF may include a metal chalcogenide, a transition metal chalcogenide, or a graphene. The metal chalcogenide or transition metal chalcogenide may be a metal compound represented by the formula $M_yX_z$ (for example, y and z are an integer of 1, 2 or more). In the above formula, M is a metal or a transition metal atom, and may include, for example, W, Mo, Ti, Zn, V or Zr. X is a chalcogen atom and may include, for example, S, Se, O or Te. In one example, each flake NF may include one selected from the group consisting of graphene, $MoS_2$, $MoSe_2$, $MoTe_2$, $WS_2$, $WSe_2$, $WTe_2$, $ReS_2$, $ReSe_2$, $TiO_2$, $TiS_2$, $TiSe_2$, $TiTe_2$, $ZnO$, $ZnS_2$, $ZnSe_2$, $WO_3$, $VS_2$, $VSe_2$, $VO_2$, $V_2O_5$, and $MoO_3$.

Each flake NF may have a monolayer, or a multi-layer in which two to ten layers are stacked. In other words, each flake NF may have a two-dimensional structure. As an example, each flake NF may have a monolayer of metal chalcogenide or a transition metal chalcogenide. As an example, each flake NF may have a multi-layer having a first monolayer and a second monolayer stacked on the first monolayer. Here, a monolayer refers to a layer having a formula of $MX_2$ when a metal decalcogenide is used as an example. In this case, the first monolayer and the second monolayer in the flake NF may be bonded to each other by a van der Waals force.

The flakes NF may contain the same material. In other words, the flakes NF may have the same composition with each other. The flakes NF may have the same crystal structure or different crystal structures. For example, the crystal structure may include a hexagonal lattice structure, a triangular lattice structure, an orthorhombic lattice structure, and a modified tetragonal (monoclinal) lattice structure. Each of the flakes NF according to this embodiment may be a nanosheet. An air gap AG may be interposed between the flake NF and the substrate 100. Alternatively, the air gap AG may be interposed between the stacked flakes NF.

A boundary defects BD may be defined between neighboring flakes NF. Since the nanosheet flakes may break off from the big chunk and break off along their edges, defects may occur. The boundary defect BD may be the edge of the flake NF. In the case of the flakes NF composed of several layers, the boundary defect BD may be a terrace. The boundary defects BD in the conductive film 110 may act as defects that interfere with the charge flow or that capture the charges before the charges are collected on the electrode. By the boundary defects BD as described above in the conductive film 110 composed of flakes, the charge mobility, electrical conductivity, and thermal conductivity of the film 110 may be reduced.

In one embodiment, the liquid phase exfoliation method may be used to form the conductive film 110. Specifically, ultrasonic waves may be applied to a transition metal chalcogenide, a metal chalcogenide, or a graphite in a solution having a condition for liquid phase exfoliation. The raw materials are compounds which have a weak Van der Waals bonding force between single layers and are easily exfoliated by ultrasonic waves or the like. The metal chalcogenide, transition metal chalcogenide or graphene may be separated and dispersed in solution in the form of the flakes NF. The dispersion solution may be centrifuged to remove the precipitate and the flakes NF may be obtained from the remaining solution. The conductive film 110 may be formed by uniformly providing the obtained flakes NF on the substrate 100.

Referring to FIGS. 3, 4 and 5, passivation regions PR may be formed on the boundary defects BD of the conductive layer 110. The passivation regions PR may be selectively provided only on the boundary defects BD of the conductive film 110. For example, the passivation region PR may not be formed on the upper surface having no boundary defects of the flake NF. Thus, the upper surface of each flake NF may be exposed.

At least one passivation region PR may be formed on the boundary defect BD. A plurality of passivation regions PR may be arranged along the boundary defect BD. Neighboring flakes NF may be interconnected by at least one passivation region PR therebetween. The passivation region PR may be interconnected to neighboring another PR.

Each of the passivation regions PR may include metal compounds selected from the group consisting of metal chalcogenides and transition metal chalcogenides. Each of the passivation regions PR may include a metal compound represented by the formula of $M_aX_b$. M is a metal or transition metal atom, and may include, for example, Zn or Cd. X is a chalcogen atom and may include, for example, S, Se, O or Te. a and b independently may be an integer of 1 or more. a and b independently may be an integer of 1 to 10. As an example, the passivation region PR may include transition metal chalcogenides such as ZnS, ZnO, ZnSe, CdSe, or CdS. The passivation region PR may include the same or different material than the flake NF of the conductive film 110.

As described above, a two-dimensional defect occurs due to a boundary defect BD between adjacent flakes NF, so that the electrical conductivity and charge mobility between adjacent flakes NF may be reduced. Meanwhile, the passivation region PR according to the inventive concept may be provided on the boundary defect BD to electrically connect neighboring flakes NF. This may increase the electrical conductivity and charge mobility between adjacent flakes NF. Furthermore, since the passivation region PR is not provided on the upper surface of the flake NF except for the boundary defect BD, the electrical characteristics of the flake NF may not be impaired. As a result, the electrical characteristics of the conductive film 110 according to the inventive concept may be improved.

The formation of passivation regions PR according to the present embodiment may use a chemical solution deposition method. The formation of passivation regions PR according to the present embodiment may use a chemical bath deposition (CBD), which is a kind of chemical solution deposition. Specifically, referring again to FIG. 5, a solution SOL may be provided in a bath BAT. The solution SOL may include precursors of a metal compound and a chalcogen compound. The substrate 100 fixed by a holder HO may be provided in the solution SOL. A deposition reaction occurs on the substrate 100, so that passivation regions PR may be formed. The deposition reaction may be performed at a temperature of 20° C. to 100° C.

The solution SOL may include a first precursor and a second precursor. The first precursor may include M-cations for forming the metal compound ($M_aX_b$). In one example, the first precursor may be metal sulfate or metal acetate. As an example, the first precursor may include zinc sulfate or cadmium acetate. The second precursor may include X-anions for forming a metal compound (MaXb). In one example, the second precursor may include a thiourea. The solution SOL may further include ammonium acetate as a buffer.

Reaction occurs between the first precursor and the second precursor in the solution SOL on the substrate 100 to form deposits so that passivation regions PR may be formed. According to embodiments of the inventive concept, the reaction rate of the deposition reaction may be lowered so that passivation regions PR are selectively formed only on the boundary defects BD of the conductive film 110. In other words, in relation to the formation of the passivation regions according to the inventive concept, it is possible to selectively form the passivation regions PR on the boundary defects BD by controlling the reaction rate of the deposition reaction.

The upper surfaces of the flakes NF may be chemically stable sites, but the boundary defects BD between the flakes NF may be chemically unstable sites. In other words, the upper surfaces of the flakes NF may be less reactive sites, and the boundary defects BD of the flakes NF may be highly reactive sites.

When the reaction rate of the deposition reaction is lowered, the reactivity of the deposition reaction may be lowered. Thus, the deposition reaction may not occur on the upper surfaces of the flakes NF, which are chemically stable sites. On the other hand, the deposition reaction may occur only on the boundary defects BD, which are chemically unstable sites. As a result, the passivation regions PR may be selectively formed only on the boundary defects BD of the conductive film 110.

In one example, lowering the reaction rate of the deposition reaction may include adjusting the pH of the solution SOL close to neutral. pH of the solution SOL may be adjusted to 7.0 to 10.0. The solution SOL may include a pH adjusting agent for adjusting pH, and pH of the solution SOL may be adjusted by adjusting the content of the pH adjusting agent. The pH adjusting agent may include a compound containing a hydroxyl group (OH—), for example, ammonium hydroxide ($NH_4OH$).

When pH of the solution SOL is high (for example, pH>10), the reaction rate of the deposition reaction may be relatively high. When pH of the solution SOL is high, the deposition reaction may occur nonselectively on the upper surfaces of the flakes NF, thereby forming a passivation film covering the upper surfaces of the flakes NF.

On the other hand, when pH of the solution SOL is low (for example, pH is 7.0 to 10), the reaction rate of the deposition reaction may be relatively low. When pH of the solution SOL is low, the deposition reaction occurs only on the boundary defects BD so that passivation regions PR may be selectively formed only on the boundary defects BD. As a result, by adjusting pH of the solution SOL to 7.0 to 10, passivation regions PR may be selectively formed only on the boundary defects BD of the conductive film 110. When pH of the solution SOL is 7.0 to 9.0, a reaction having high selectivity occurs, and a passivation region may be selectively formed only on the boundary defect BD.

As another example, lowering the reaction rate of the deposition reaction may include adjusting the ratio of the second precursor to the first precursor of solution SOL. The ratio (i.e., [X]/[M]) of the molar concentration of the X-anions to the molar concentration of the M-cations in the solution SOL may be 9 to 20. For example, when the concentration of M-cations in the solution SOL is 0.01 M, the concentration of X-anions may be 0.09 M to 0.2 M. When the ratio (i.e., [X]/[M]) of the molar concentration of the X-anions to the molar concentration of the M-cations in the solution SOL is 10 to 20, a reaction with high selectivity may occur.

The concentration of the X-anions in the solution SOL may be inversely proportional to the reaction rate of the deposition reaction. When the ratio of the X-anion to the M-cation in the solution SOL is relatively small (e.g., 1 to 8), the reaction rate of the deposition reaction may be relatively high. When the ratio of the X-anion to the M-cation in the solution SOL is relatively small, the deposition reaction occurs on the upper surfaces of the flakes NF, thereby forming a passivation film covering the upper surfaces of the flakes NF.

When the ratio of the X-anion to the M-cation in the solution SOL is relatively large (e.g., 9 to 20), the reaction rate of the deposition reaction may be relatively small. When the ratio of the X-anion to the M-cation in the solution SOL is relatively large, the deposition reaction occurs only on the boundary defects BD, so that passivation regions PR may be selectively formed only on the boundary defects BD. As a result, by adjusting the ratio of the X-anion to the M-cation in the solution SOL to 9 to 20, passivation regions PR may be selectively formed only on the boundary defects BD of the conductive film 110.

In another embodiment of the inventive concept, formation of the passivation regions PR may be accomplished through dipping, drop casting, spray coating, or spin coating methods using the above-described solution SOL.

Figure 6:
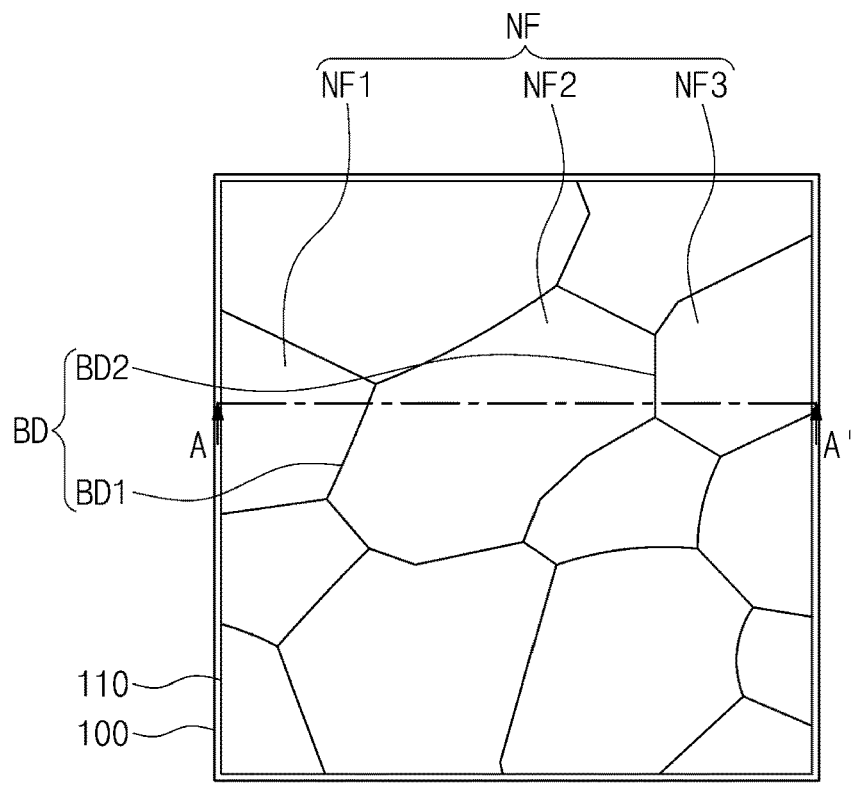
FIGS. 6 and 8 are plan views illustrating a method of manufacturing a conductive film according to embodiments of the inventive concept.
Figure 7:
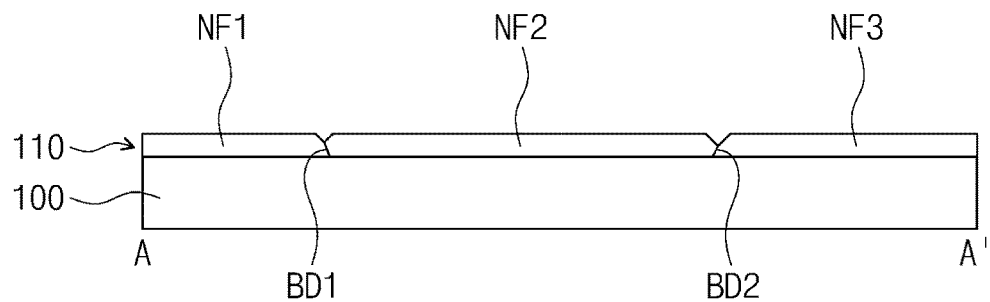
FIGS. 7 and 9 are cross-sectional views taken along the line A-A' in FIGS. 6 and 8, respectively.
Figure 8:
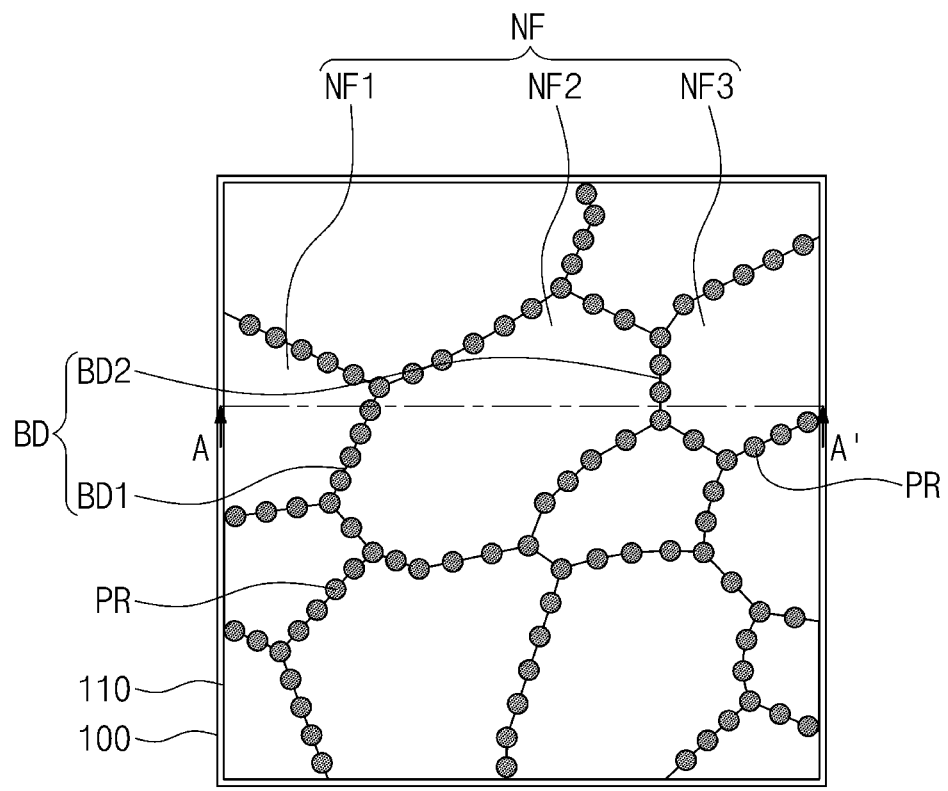
Figure 9:
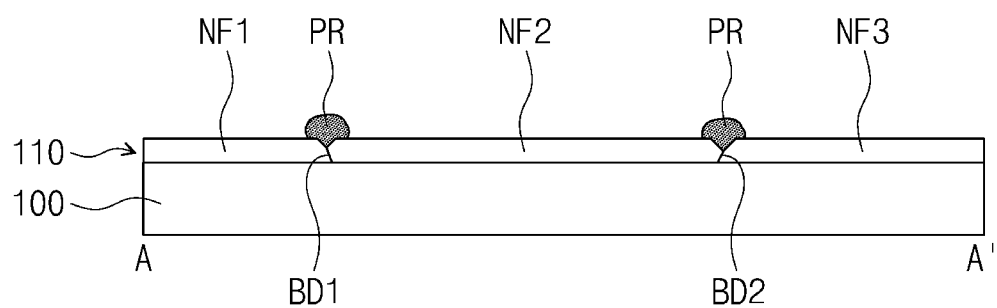

FIGS. 6 and 8 are plan views illustrating a method of manufacturing a conductive film according to embodiments of the inventive concept. FIGS. 7 and 9 are cross-sectional views taken along the line A-A' in FIGS. 6 and 8, respectively. In this embodiment, the detailed description of the technical features overlapping with those described with reference to FIGS. 1 to 5 will be omitted, and the differences will be described in detail.

Referring to FIGS. 6 and 7, a conductive film 110 may be formed on a substrate 100. The conductive film 110 may include a plurality of flakes NF. The conductive film 110 may be a semiconductor or a conductor. Each of the flakes NF according to this embodiment may be a crystal grain. For example, the conductive film 110 may be formed through a vapor deposition method. In other words, the conductive film 110 may be deposited directly on the substrate 100.

Specifically, the flakes NF may include first to third flakes NF1, NF2, and NF3. The first to third flakes NF1, NF2, and NF3 may be disposed adjacent to each other in one direction. The first flake NF1 and the second flake NF2 may be crystal grains having different orientations and the second flake NF2 and the third flake NF3 may be crystal grains having different orientations. A first boundary defect BD1 may be defined between the first and second flakes NF1 and NF2 and a second boundary defect BD2 may be defined between the second and third flakes NF2 and NF3. For example, the first boundary defect BD1 and the second boundary defect BD2 may be grain boundaries. In other words, the grain boundary may also act as a defect.

Referring to FIGS. 8 and 9, at least one passivation region PR may be formed in the first boundary defect BD1 and at least one passivation region PR may be formed in the second boundary defect BD2. A plurality of passivation regions PR may be arranged along the first boundary defect BD1. A plurality of passivation regions PR may be arranged along the second boundary defect BD2. The first flake NF1 and the second flake NF2 may be connected to each other by at least one passivation region PR of the first boundary defect BD1. The second flake NF2 and the third flake NF3 may be connected to each other by at least one passivation region PR of the second boundary defect BD2. Formation of the passivation regions PR may be substantially the same as that described with reference to FIGS. 3 to 5 above.

Figure 10:
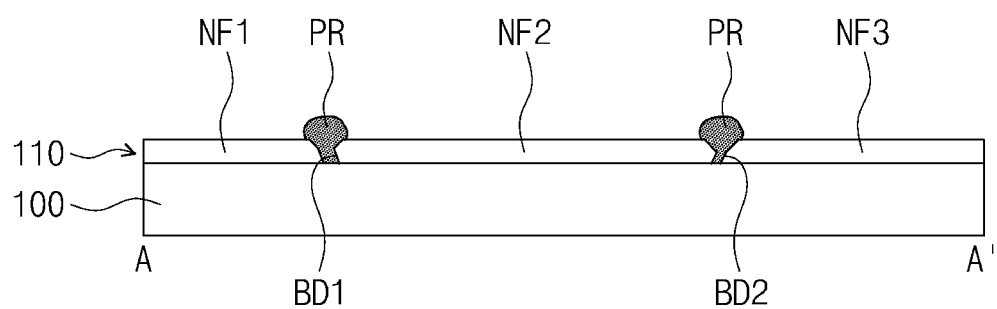
FIG. 10 is a cross-sectional view taken along the line A-A' in FIG. 8 for illustrating a conductive film according to an embodiment of the inventive concept.
Figure 11:
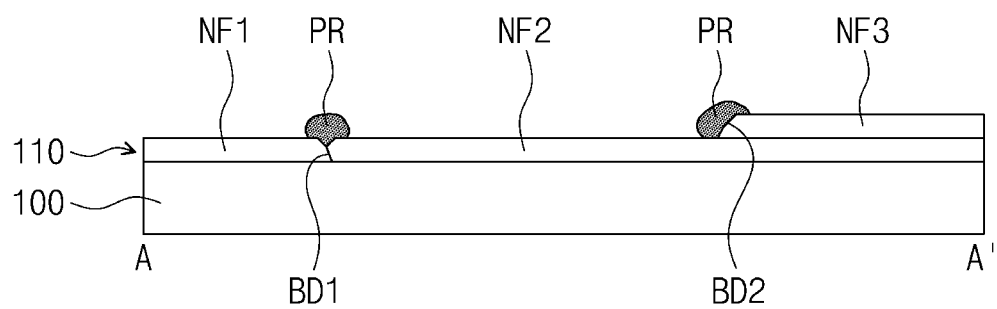
FIG. 11 is a cross-sectional view taken along the line A-A' in FIG. 8 for illustrating a conductive film according to another embodiment of the inventive concept.

FIG. 10 is a cross-sectional view taken along the line A-A' in FIG. 8 for illustrating a conductive film according to an embodiment of the inventive concept. FIG. 11 is a cross-sectional view taken along the line A-A' in FIG. 8 for illustrating a conductive film according to another embodiment of the inventive concept. In this embodiment, the detailed description of the technical features overlapping with those described with reference to FIGS. 6 to 9 will be omitted, and the differences will be described in detail.

Referring to FIGS. 8 and 10, at least a portion of the first flake NF1 and at least a portion of the second flake NF2 may be spaced apart from each other with the first boundary defect BD1 therebetween. At least a portion of the second flake NF2 and at least a portion of the third flake NF3 may be spaced apart from each other with the second boundary defect BD2 therebetween. The first boundary defect BD1 and the second boundary defect BD2 may expose a portion of the upper surface of the substrate 100.

The passivation region PR may fill each of the first boundary defect BD1 and the second boundary defect BD2. The passivation region PR may cover a portion of the upper surface of the exposed substrate 100. By the passivation region PR, at least a portion of the first flake NF1 and at least a portion of the second flake NF2 may be electrically connected to each other. By the passivation region PR, at least a portion of the second flake NF2 and at least a portion of the third flake NF3 may be electrically connected to each other.

Referring to FIGS. 8 and 11, the third flake NF3 may be provided on the second flake NF2. The third flake NF3 may cover at least a portion of the upper surface of the second flake NF2. The second boundary defect BD2 may be defined on one side of the third flake NF3. The second boundary defect BD2 may be defined on the upper surface of the second flake NF2.

The passivation region PR may be provided on the second boundary defect BD2. The passivation region PR may cover one side of the third flake NF3 and a portion of the upper surface of the second flake NF2. By the passivation region PR, the second flake NF2 and the third flake NF3 may be electrically connected to each other.

Experimental Example $MoS_2$ single crystals were put into an aqueous solution mixed with a surfactant or an alcohol, and ultrasonic waves were applied to exfoliate thin flakes composed of one or more layers. An organic solvent may be used instead of the aqueous solution. By using centrifugation, precipitates that are not exfoliated were removed and $MoS_2$ flakes were separated from the remaining solution. The $MoS_2$ flakes were uniformly provided on the glass substrate to form a $MoS_2$ film. The $MoS_2$ film is composed of a plurality of flakes.

A solution SOL was prepared in the bath BAT shown in FIG. 5. The solution SOL was prepared by mixing zinc sulfate ($ZnSO_4$) as the first precursor and thiourea as the second precursor. The concentration of zinc sulfate in the solution SOL was adjusted to 10 mM and the concentration of thiourea in the solution SOL was adjusted to 100 mM. By using $NH_4OH$ as the pH adjusting agent, pH of the solution SOL was adjusted to 7.5 to 9.5. The temperature of the solution SOL in the bath BAT was adjusted to about 70° C.

The substrate on which the $MoS_2$ film was formed was immersed in the solution SOL of the bath BAT and the deposition reaction of ZnS was performed. The solution SOL was continuously stirred through a stirrer SIT during the reaction time. The substrate where the ZnS deposition was completed was washed with ethanol and distilled water.

As a result of examining the substrate washed with an AFM image, it was confirmed that ZnS particles (or patterns) were selectively formed at the boundary between $MoS_2$ flakes as illustrated in FIG. 3. ZnS particles were not formed on the upper surfaces of the $MoS_2$ flakes.

Figure 12:
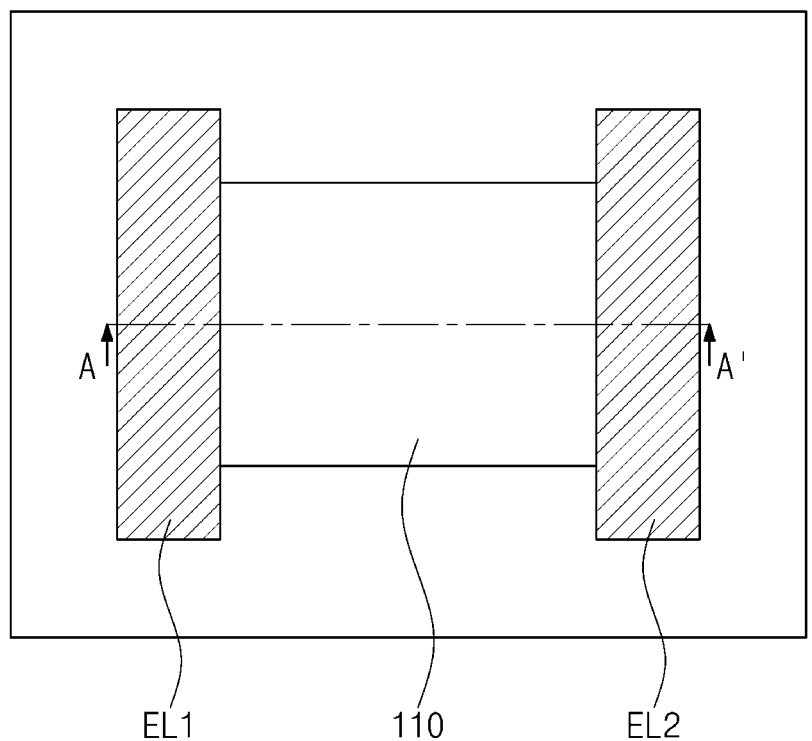
FIG. 12 is a plan view for explaining an electronic device according to embodiments of the inventive concept.
Figure 13:
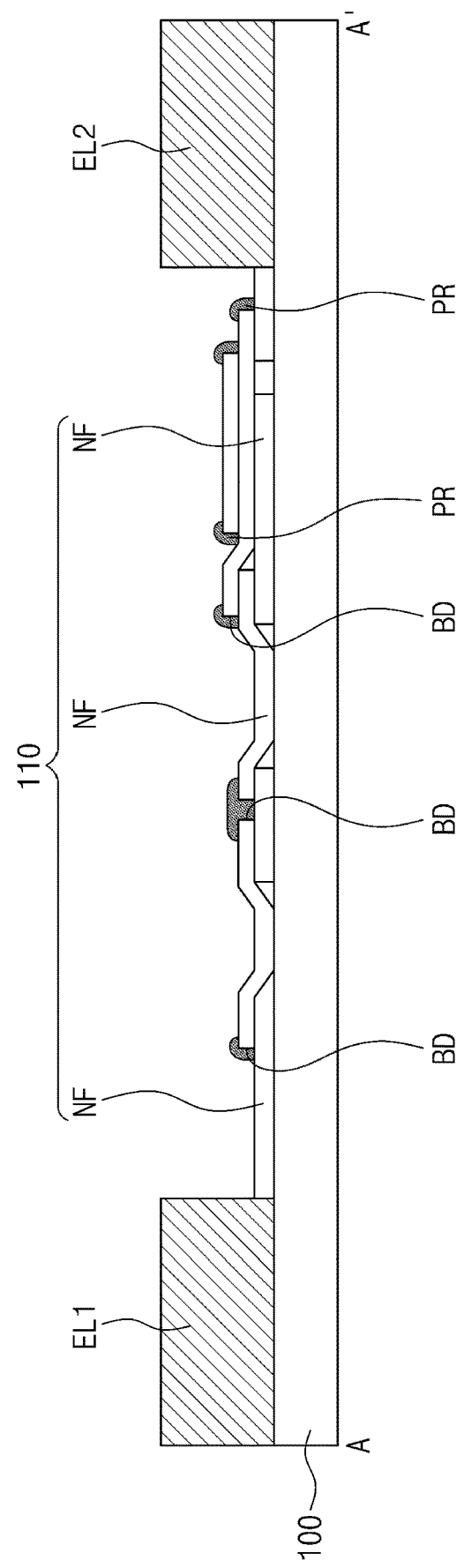
FIG. 13 is a cross-sectional view taken along a line A-A' of FIG. 12.

FIG. 12 is a plan view for explaining an electronic device according to embodiments of the inventive concept. FIG. 13 is a cross-sectional view taken along a line A-A' of FIG. 12. In this embodiment, the detailed description of the technical features overlapping with those described with reference to FIGS. 1 to 5 will be omitted, and the differences will be described in detail.

Referring to FIGS. 12 and 13, a conductive film 110, a first electrode EL1, and a second electrode EL2 may be provided on a substrate 100. The conductive film 110 may be the same as the conductive film 110 described with reference to FIGS. 3 and 4 above. The conductive film 110 may include flakes NF and passivation regions PR selectively provided on the boundary defects BD of the flakes NF.

The conductive film 110 is provided between the first electrode EL1 and the second electrode EL2 to electrically connect them. A carrier (e.g., an electron or a hole) may move between the first electrode EL1 and the second electrode EL2 through the conductive film 110. In relation to the conductive film 110 according to the present embodiment, since the grain boundaries are passivated through the passivation regions PR, a current may smoothly flow in proportion to a voltage difference between the first electrode EL1 and the second electrode EL2. An electronic device according to this embodiment may be used as a photoelectric device or a semiconductor device.

Figure 14:
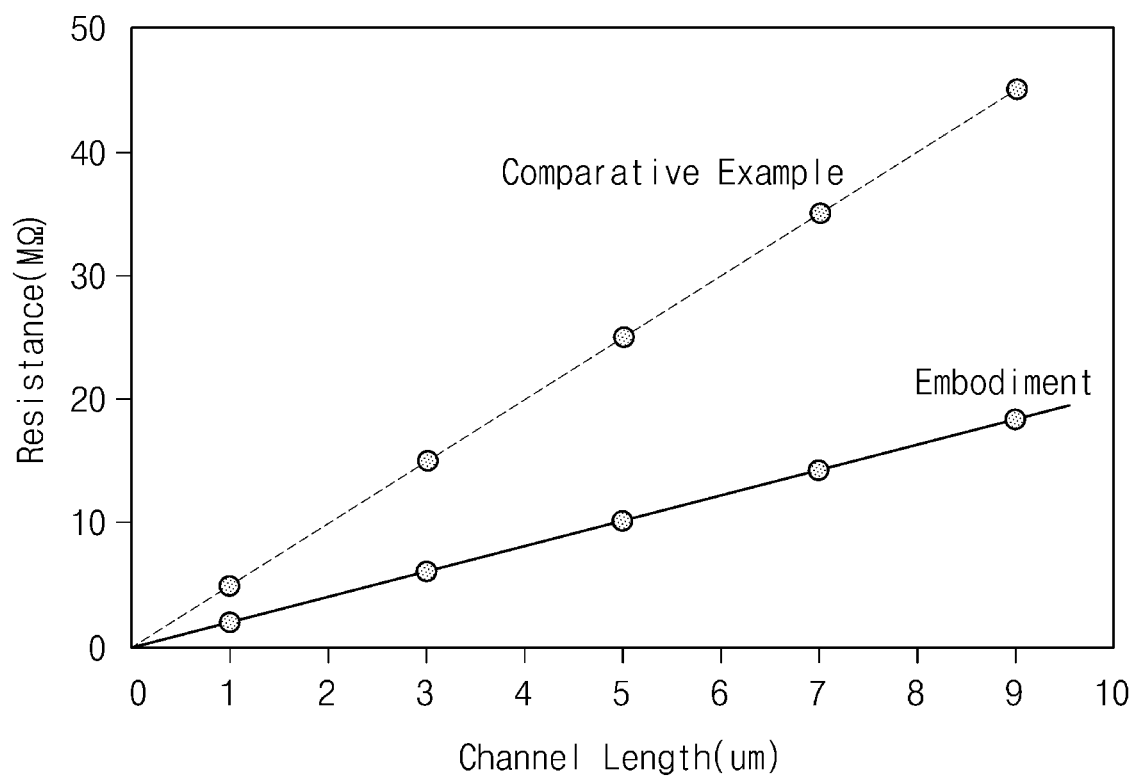
FIG. 14 is a graph showing resistance according to channel lengths of a conductive film according to an embodiment of the inventive concept and a conductive film according to a comparative example.

FIG. 14 is a graph showing resistance according to channel lengths of a conductive film according to an embodiment of the inventive concept and a conductive film according to a comparative example. Resistance according to the length (i.e., channel length) of the conductive film 110 of the electronic device shown in FIGS. 12 and 13 was measured (Embodiment). Meanwhile, unlike the conductive film 110 of FIGS. 12 and 13, an electronic device using a conductive film where passivation regions PR are omitted is prepared. The resistance according to the length (i.e., the channel length) of the conductive film was measured (Comparative Example). The results are shown in FIG. 14.

Referring to FIG. 14, it may be confirmed that the current flowing through the channel is more than twice as the electronic device according to the embodiment of the inventive concept is compared with the electronic device according to the comparative example which is not passivated.

The method for manufacturing a conductive film according to the inventive concept may selectively passivate defects in a conductive film to improve its electrical characteristics. Selective passivation of defects in a conductive film may be achieved by adjusting the reaction rate of the deposition reaction in a solution without complex processes and reactors. In relation to selective defect passivation, the passivation region is formed only in the defective region and does not hinder the characteristics of the conductive film. Selective defect passivation passivates only defects, and the passivation material does not replace the properties of the conductive film.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A method of manufacturing a conductive film, the method comprising:
    forming a conductive film including a plurality of flakes on a substrate, wherein the conductive film is a semiconductor or a conductor; and
    forming a passivation region selectively on a boundary between the flakes adjacent to each other,
    wherein the passivation region comprises a metal compound selected from the group consisting of metal chalcogenide and transition metal chalcogenide,
    wherein the forming of the passivation region comprises providing a solution containing a first precursor including a cation of the metal compound and a second precursor including an anion of the metal compound on the conductive film,
    wherein pH of the solution is between 7.0 and 10.0.

2. The method of claim 1, wherein the metal compound is represented by a formula of $M_aX_b$,
    where M comprises Zn or Cd, X comprises S, Se, O or Te, and a and b are independently an integer of 1 or more.

3. The method of claim 1, wherein a ratio of a molar concentration of an anion of the metal compound to a molar concentration of a cation of the metal compound in the solution is 9 to 20.

4. The method of claim 1, wherein the boundary is a grain boundary.

5. The method of claim 1, wherein each of the flakes comprises metal chalcogenide, transition metal chalcogenide, or graphene,
    wherein each of the flakes has a monolayer, or a multilayer where two to ten monolayers are stacked.

6. The method of claim 1, wherein the forming of the conductive film comprises:
    exfoliating metal chalcogenide, transition metal chalcogenide, or graphene to form the flakes dispersed in a solution; and
    uniformly providing the flakes on the substrate.

7. The method of claim 1, wherein the passivation region is formed in a plurality and is arranged along the boundary.

8. The method of claim 1, wherein the passivation region is not formed on upper surfaces of the flakes.

9. The method of claim 1, wherein the flakes adjacent to each other are spaced apart from each other with the boundary therebetween,
    wherein the passivation region is formed to fill the boundary to connect the flakes adjacent to each other.

10. The method of claim 1, wherein the flakes adjacent to each other comprise a first flake and a second flake on the first flake,
   wherein the second flake covers at least a portion of an upper surface of the first flake,
   wherein the boundary is defined at an edge of the second flake on the upper surface of the first flake.

\* \* \* \* \*